United States Patent
Ninomiya

(10) Patent No.: US 12,433,177 B2
(45) Date of Patent: Sep. 30, 2025

(54) MEMORY DEVICE HAVING IMPROVED MEMORY CELL STRUCTURES TO PREVENT FORMATION OF VOIDS THEREIN

(71) Applicant: HEFEI RELIANCE MEMORY LIMITED, Anhui (CN)

(72) Inventor: Takeki Ninomiya, Osaka (JP)

(73) Assignee: Hefei Reliance Memory Limited, Hefei (CN)

(*) Notice: Subject to any disclaimer, the term of this patent is extended or adjusted under 35 U.S.C. 154(b) by 437 days.

(21) Appl. No.: 18/106,740

(22) Filed: Feb. 7, 2023

(65) Prior Publication Data

US 2023/0247920 A1     Aug. 3, 2023

Related U.S. Application Data

(63) Continuation of application No. PCT/CN2020/107856, filed on Aug. 7, 2020.

(51) Int. Cl.
*H10N 70/20*     (2023.01)
*H01L 23/522*    (2006.01)
(Continued)

(52) U.S. Cl.
CPC ....... *H10N 70/841* (2023.02); *H01L 23/5226* (2013.01); *H01L 23/5283* (2013.01); *H10B 63/34* (2023.02); *H10N 70/883* (2023.02)

(58) Field of Classification Search
CPC ............... H10N 70/841; H10N 70/883; H01L 23/5226; H01L 23/5283; H10B 63/34
See application file for complete search history.

(56) References Cited

U.S. PATENT DOCUMENTS 9,343,207 B2   5/2016  Fukuda et al.
11,770,938 B2  9/2023  Seong et al.
(Continued)

FOREIGN PATENT DOCUMENTS

CN    102376651 A    3/2012
CN    107104121 A    8/2017
(Continued)

OTHER PUBLICATIONS

Notice of Allowance dated May 10, 2025, issued in related Korean Application No. 10-2023-7007969, with English machine translation (3 pages).

(Continued)

*Primary Examiner* — Mark V Prenty
(74) *Attorney, Agent, or Firm* — Sheppard Mullin Richter & Hampton LLP

(57) ABSTRACT

A memory device includes a memory cell comprising a bottom electrode, a top electrode, and a dielectric layer interposed between the bottom electrode and the top electrode. The bottom electrode has a first width W1. The top electrode has a top surface that has a second width W2 between two edges of the top surface. The memory cell has a first height H1 extending from a lower surface of the bottom electrode to the top surface of the top electrode. The memory device further includes a top contact wire coupled to the top electrode. The top contact wire has a top surface that has a third width W3, a second height H2 at a location between two adjacent memory cells, and a third height H3 extending between the top surface of the top contact wire and the insulating layer, where W1>W3>W2 and H2>H1>H3.

20 Claims, 7 Drawing Sheets

(51) Int. Cl.
    *H01L 23/528*     (2006.01)
    *H10B 63/00*     (2023.01)
    *H10N 70/00*     (2023.01)

(56) References Cited

U.S. PATENT DOCUMENTS

| | | |
|---|---|---|
| 2012/0119297 A1 | 5/2012 | Schulz |
| 2014/0216539 A1 | 8/2014 | Johnston et al. |
| 2019/0245141 A1 | 8/2019 | Yang et al. |
| 2020/0083222 A1 | 3/2020 | Kim et al. |
| 2023/0247920 A1* | 8/2023 | Ninomiya ........... H01L 23/5283 257/4 |

FOREIGN PATENT DOCUMENTS

| | | |
|---|---|---|
| CN | 110890364 A | 3/2020 |
| JP | 2014-207440 A | 10/2014 |
| KR | 10-2014-0068162 A | 6/2014 |
| KR | 10-2014-0142929 A | 12/2014 |
| KR | 10-2017-0122660 A | 11/2017 |
| KR | 10-2020-0036714 A | 4/2020 |

OTHER PUBLICATIONS

PCT International Preliminary Report on Patentability mailed Feb. 16, 2023, issued in related International Application No. PCT/CN2020/107856 (5 pages).
First Search dated Nov. 26, 2024, issued in related Chinese Patent Application No. 202080017725.5 (2 pages).
Notice to Submit Response dated Oct. 31, 2024, issued in related Korean Patent Application No. 10-2023-7007969, with English machine translation (5 pages).
PCT International Search Report and the Written Opinion mailed Apr. 29, 2021, issued in related International Application No. PCT/CN2020/107856 (6 pages).

* cited by examiner

MEMORY DEVICE HAVING IMPROVED MEMORY CELL STRUCTURES TO PREVENT FORMATION OF VOIDS THEREIN

CROSS REFERENCE TO RELATED APPLICATION

This application is a continuation and claims the benefits of International Application No. PCT/CN2020/107856, filed Aug. 7, 2020, entitled "MEMORY DEVICE HAVING IMPROVED MEMORY CELL STRUCTURES TO PREVENT FORMATION OF VOIDS THEREIN," the content of which is incorporated by reference herein in its entirety.

TECHNICAL FIELD

The disclosure is related generally to memory devices having a plurality of memory cells, and more particularly to memory devices having a plurality of memory cells with improved cell structures to prevent formation of voids in the memory devices.

BACKGROUND

Memory devices are included in many electronic devices, such as cell phones, computers, cars, display devices, etc. Memory devices have been utilized to store data for various purposes. Generally, memory devices include two types of memory depending on whether the data stored therein is retained or erased after power is cut off. In volatile memory devices, the data is wiped out every time the power to the volatile memory devices are turned off. Whereas data stored in a non-volatile memory device is retained even after the power is turned off.

A memory device generally includes a memory array that has tens of thousands of memory cells. FIGS. 1A-1C are schematic diagrams illustrating a process for forming a conventional memory device 100. Referring to FIG. 1A, the memory device 100 includes a plurality of memory cells 101. Each of the memory cells 101 includes a bottom electrode 102, a top electrode 104, a dielectric layer 106 interposed between the bottom electrode 102 and the top electrode 104, and a first insulating layer 108 disposed on the top electrode 104. The bottom electrode 102 is connected to a bottom contact wire 110 through a via 112. The top electrode 104 is connected to a top contact wire (not shown). The bottom contact wire is disposed on a substrate 114. The via 112 is disposed in a second insulating layer 116 that separates the bottom electrode 102 and the bottom contact wire 110. A third insulating layer 118 is disposed on the memory cells 101, covering side and top surfaces of the memory cells 101. A fourth insulating layer 120 is formed on the third insulating layer 118.

FIG. 1A shows an interim stage of depositing the fourth insulating layer 120 on the third insulating layer 118. FIG. 1B shows a later interim stage of depositing the fourth layer 120 on the third insulating layer 118. FIG. 1C shows the fourth insulating layer 120 in its complete form. As shown in FIG. 1C, because of the high density of memory cells 101 in the memory device 100, the deposition process generates a void 130 in the fourth insulating layer 120. The void 130 degrades the performance and reliability of the memory device 100. In some situations, the thickness of the memory cells 101 needs to be increased, which further exacerbates the issue of void formation.

SUMMARY

One aspect of the present disclosure is directed to a memory device. The memory device includes a memory cell comprising a bottom electrode, a top electrode, and a dielectric layer interposed between the bottom electrode and the top electrode. The bottom electrode has a first width W1. The top electrode has a top surface that has a second width W2 between two edges of the top surface. The memory cell has a first height H1 extending from a lower surface of the bottom electrode to the top surface of the top electrode. The memory device further includes an insulating layer and a top contact wire. The insulating layer covers side surfaces of the memory cell. The top contact wire is coupled to the top electrode via an opening in the insulating layer. The top contact wire has a top surface that has a third width W3, a second height H2 at a location between two adjacent memory cells, and a third height H3 extending between the top surface of the top contact wire and the insulating layer. The widths and the heights satisfy the following conditions: W1>W3>W2 and H2>H1>H3. In some embodiments, the memory device further includes a bottom contact wire coupled to the bottom electrode.

In some embodiments, an angle between the lower surface of the bottom electrode and a side surface of the memory cell is less than 82 degrees.

In some embodiments, the top surface of the top electrode is flat, convex, or concave. A distance between bottom electrodes of the two adjacent memory cells is smaller than the third width W3.

In some embodiments, the dielectric layer is a resistive layer that has resistance varying depending on a voltage between the top electrode and the bottom electrode. In some embodiments, the resistive layer includes a first film and a second film disposed on the first film, the second film being different from the first film. In some embodiments, the first film includes a first metal oxide, and the second film includes a second metal oxide.

In some embodiments, the insulating layer is a first insulating layer and the memory device further comprises a second insulating layer disposed on the first insulating layer and between two adjacent top contact wires. The second insulating layer includes no voids between the two adjacent top contact wires. In some embodiments, the first insulating layer includes silicon oxide. The second insulating layer includes a low dielectric material. In some embodiments, the second insulating layer has a thickness greater than a thickness of the first insulating layer.

In some embodiments, the bottom electrode includes at least one of TiN, TaN, or W. In some embodiments, the top electrode includes at least one of TiN, TaN, or Ru.

In some embodiments, the second height H2 is greater than the first height H1 by at least 10 nm. In some embodiments, the first height H1 is greater than the third height H3 by at least 10 nm.

In some embodiments, the memory device further includes a third insulating layer interposed between the first insulating layer the top electrode. The top contact wire is coupled to the top electrode via the opening in the first insulating layer and the third insulating layer. In some embodiments, a thickness of the top electrode is more than two times a thickness of the dielectric layer.

Another aspect of the present disclosure is directed to a memory device. The memory device includes a plurality of memory cells. Each of the memory cells includes a bottom electrode, a top electrode, and a dielectric layer interposed between the bottom electrode and the top electrode. Each of the memory cells has a first height H1 extending from a lower surface of the bottom electrode to the top surface of the top electrode. The memory device further includes an insulating layer covering side surfaces of the memory cells and a top contact wire coupled to the top electrode via an opening in the insulating layer. The top contact wire has a top surface that has a width W, a second height H2 at a location between two adjacent memory cells, and a third height H3 extending between the top surface of the top contact wire and the insulating layer. A distance between bottom electrodes of the two adjacent memory cells is smaller than the width. The heights satisfy the following condition: H2>H1>H3.

These and other features of the apparatuses, systems, and methods, disclosed herein, as well as the methods of operation and functions of the related elements of structure, will become more apparent upon consideration of the following description and the appended claims with reference to the accompanying drawings, all of which form a part of this specification. It is to be expressly understood, however, that the drawings are for purposes of illustration and description only and are not intended as a definition of the limits of the disclosure. It is to be understood that the foregoing general description and the following detailed description are exemplary and explanatory only, and are not restrictive of the disclosure, as claimed.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the disclosure are utilized, and the accompanying drawings. Non-limiting embodiments of the disclosure may be more readily understood by referring to the following drawings.

DETAILED DESCRIPTION OF EMBODIMENTS

Non-limiting embodiments of the present disclosure will now be described with reference to the drawings. It should be understood that particular features and aspects of any embodiment disclosed herein may be used and/or combined with particular features and aspects of any other embodiment disclosed herein. It should also be understood that such embodiments are by way of example and are merely illustrative of a small number of embodiments within the scope of the present disclosure. Various changes and modifications obvious to one skilled in the art to which the present disclosure pertains are deemed to be within the spirit, scope and contemplation of the present disclosure as further defined in the appended claims.

Techniques disclosed herein provide memory devices that can overcome the drawbacks of the conventional memory device. Solutions provided by the following embodiments can provide more reliable and robust memory devices with improved memory cell structures to prevent formation of voids between memory cells during the deposition of the interfacial insulation layer. The improved memory cell structures include tapered side surfaces of the memory cells to facilitate the stacking of the interfacial insulation layer on the memory cells.

Figure 1A:
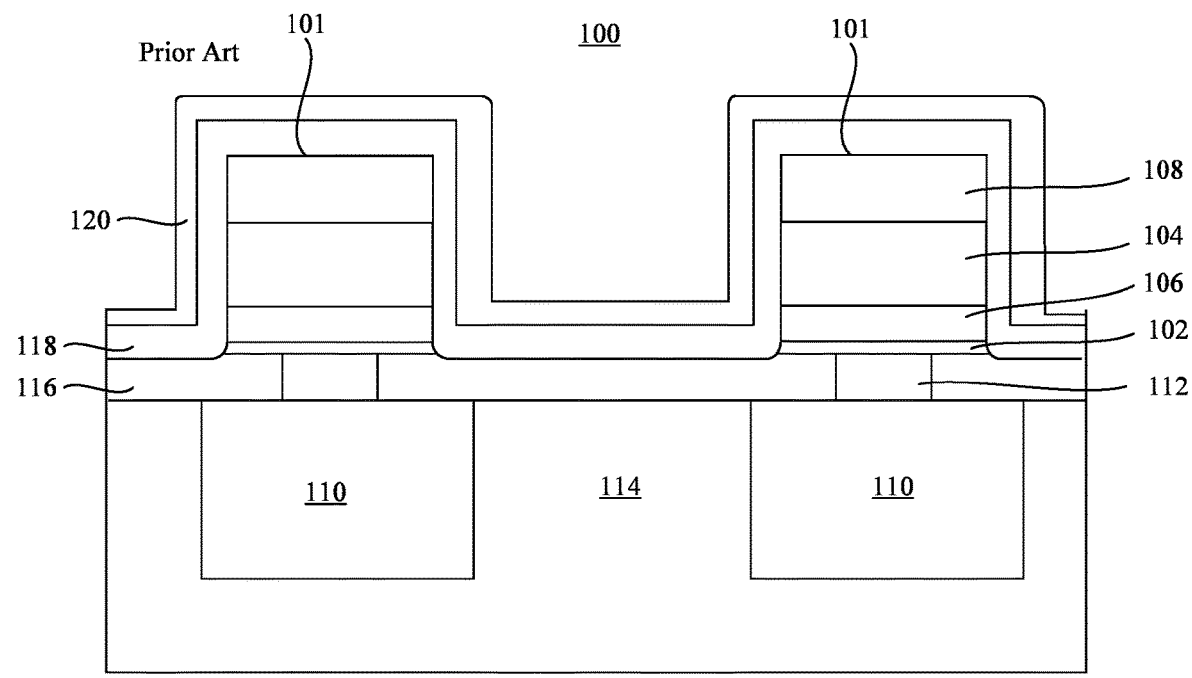
FIGS. 1A-1C are schematic diagrams illustrating a process for forming a conventional memory device 100.
Figure 1B:
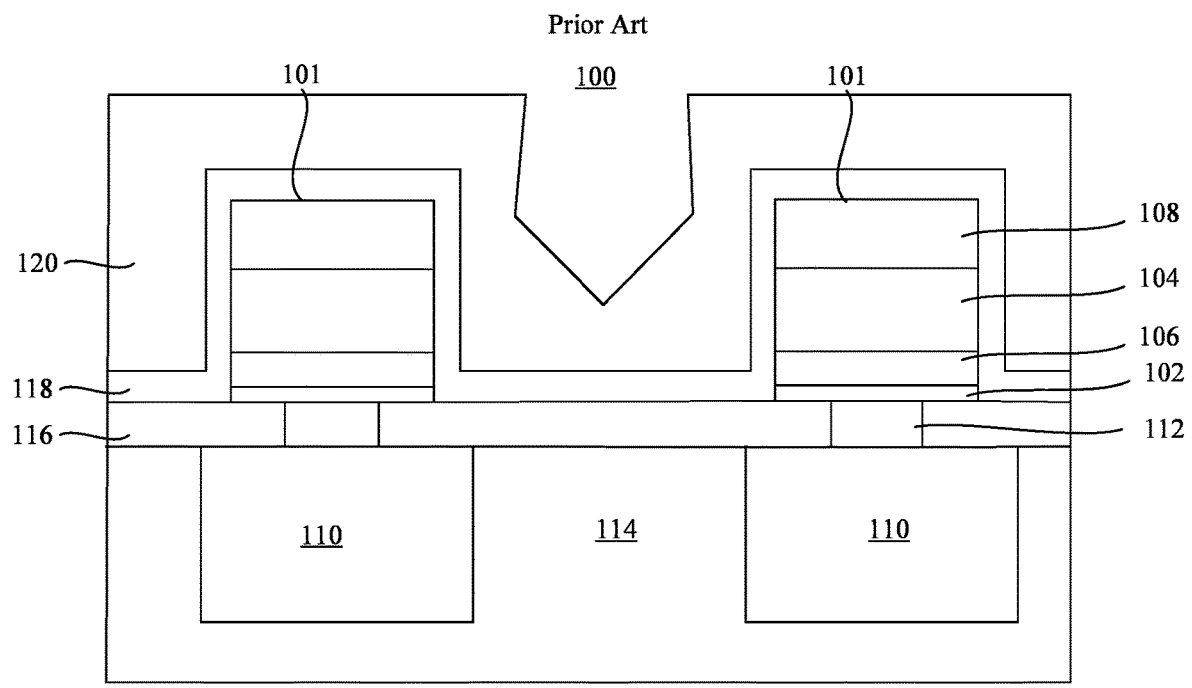
Figure 1C:
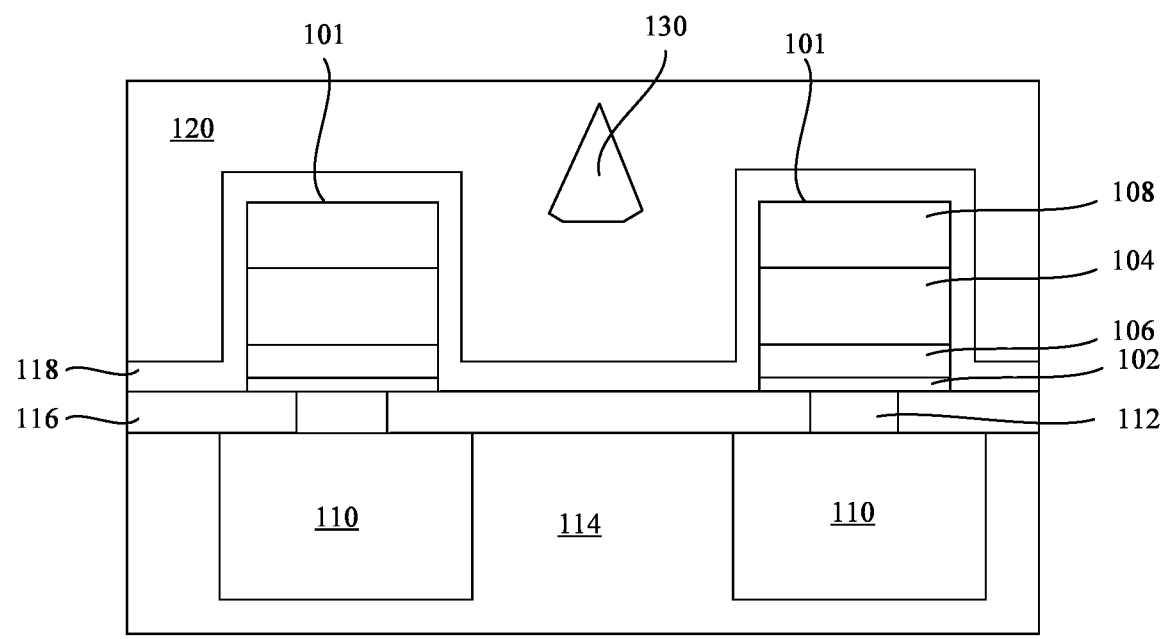
Figure 2A:
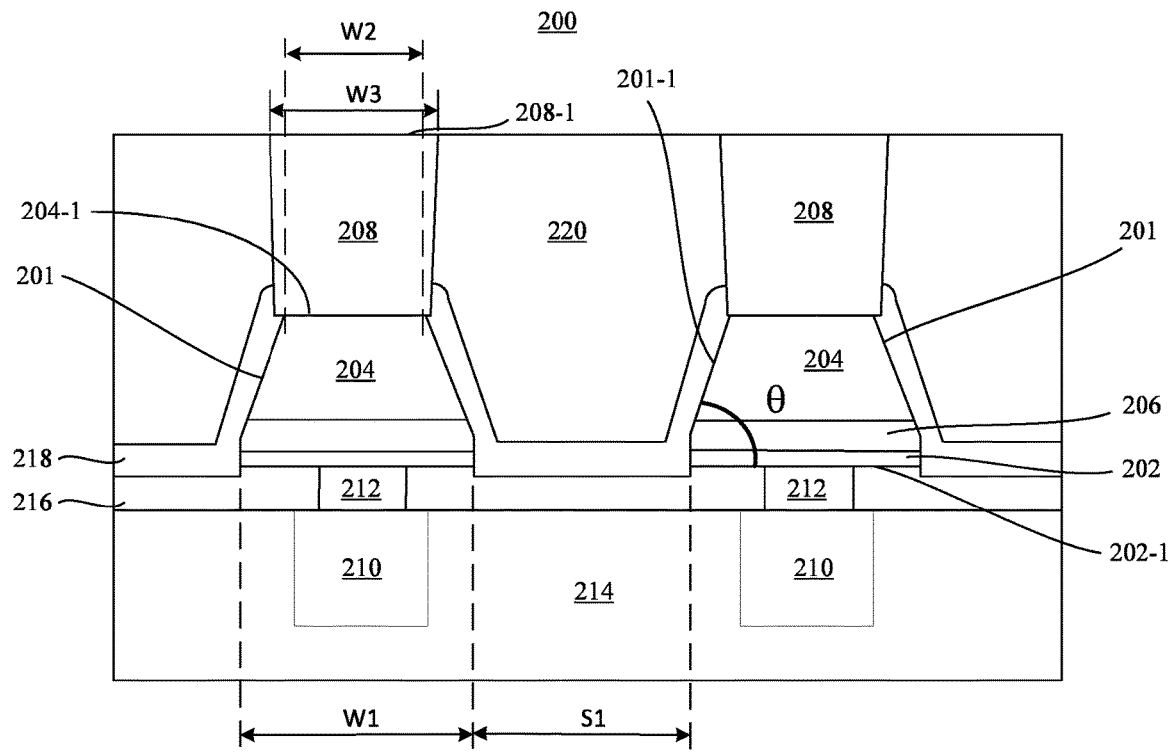
FIG. 2A is a schematic diagram illustrating a cross-section view of a memory device along the X direction, according to one example embodiment.
Figure 2B:
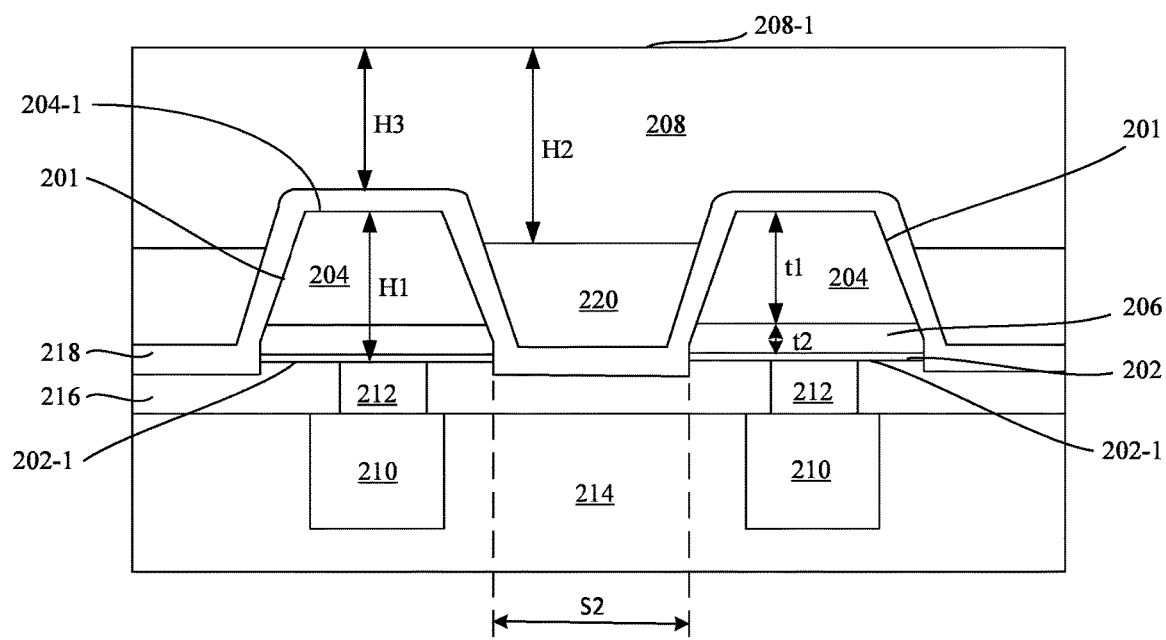
FIG. 2B is a schematic diagram illustrating a cross-section view of the memory device shown in FIG. 2A along the Y direction, according to one example embodiment.

Embodiments will now be explained with accompanying figures. Reference is first made to FIGS. 2A and 2B. FIG. 2A is a schematic diagram illustrating a cross-section view of a memory device 200 along the X direction, according to one example embodiment. FIG. 2B is a schematic diagram illustrating a cross-section view of the memory device 200 along the Y direction, according to one example embodiment.

Referring to FIGS. 2A and 2B, the memory device 200 includes a plurality of memory cells 201 (two are shown in FIG. 2A). Each of the memory cells 201 includes a bottom electrode 202, a top electrode 204, and a dielectric layer 206 interposed between the bottom electrode 202 and the top electrode 204. The bottom electrode 202 has a first width W1. The top electrode 204 has a top surface 204-1 that has a second width W2 between two edges of the top surface 204-1. The top electrode 204 is coupled to a top contact wire 208. The top contact wire 208 has a top surface 208-1 that has a third width W3. The bottom electrode 202 is coupled to a bottom contact wire 210 through a via 212. The bottom contact wire 210 is disposed on a substrate 214. The via 212 is disposed in a first insulating layer 216 that separates the bottom electrode 202 and the bottom contact wire 210. A second insulating layer 218 is disposed on the memory cells 201, covering side surfaces 201-1 and top surfaces of the memory cells 201. A third insulating layer 220 is formed on the second insulating layer 218.

Referring to FIG. 2B, the memory cell 201 has a first height H1 extending from a lower surface 202-1 of the bottom electrode 202 to the top surface 204-1 of the top electrode 204. The top contact wire 208 has a second height H2 at a location between two adjacent memory cells 201 and a third height H3 extending between the top surface 208-1 of the top contact wire 208 and the second insulating layer 218. The top contact wire 208 is coupled to the top electrode 204 via the opening in the second insulating layer 218 and the third insulating layer 220 (FIG. 2A). In the improved memory cell structures shown in FIGS. 2A and 2B, the widths W1, W, W3 and the heights H1, H2, H3 satisfy the following conditions: W1>W3>W2 and H2>H1>H3. These conditions define an improved structure to prevent formation of voids in the third insulating layer 220. As shown in FIG. 2A, no void is formed in the third insulating layer 220 between two adjacent top contact wires 208. The structures result in the memory cells 201 having a taper angle θ of less than 82 degrees between the lower surface 202-1 of the bottom electrode 202 and the side surface 201-1 of the memory cells 201. In some instances, the angle θ may be defined as between the side surface 201-1 of the memory cells 201 and a lower surface of the top electrode 204.

In some embodiments, in the improved memory cell structures, the second height H2 is greater than the first height H1 by at least 10 nm. The first height H1 is greater than the third height H3 by at least 10 nm. In some embodiments, a thickness t1 of the top electrode 204 is more than two times a thickness t2 of the dielectric layer 206. For example, a first height H1, a second height H2, and a third height H3 for an example memory cell structure may be 110 nm, 135 nm, and 65-75 nm, respectively.

In some embodiments, the improved memory cell structures shown in FIGS. 2A and 2B further define a distance (S1 in FIG. 2A or S2 in FIG. 2B) between bottom electrodes of the two adjacent memory cells 201, where the third width W3 is greater than either S1 or S2 and H2>H1>H3. For example, the third width W3 and the distance S1 or S2 may be 150 nm and less than 120 nm, respectively. These conditions also allow the memory cells 201 to have a taper angle θ of less than 82 degrees between the lower surface 202-1 of the bottom electrode 202 and the side surface 201-1 of the memory cells 201.

In some embodiments, the bottom electrode 202 may include at least one of TiN, TaN, W, or other suitable conductive materials. In some embodiments, the top electrode 204 includes at least one of TiN, TaN, Ru, Pt, Jr, W, and other suitable conductive materials. The dielectric layer 206 may be a resistive layer containing a resistive material that has resistance varying depending on a voltage between the top electrode 204 and the bottom electrode 202. For example, the dielectric layer 206 may include one or more resistive metal oxides, such as $Ta_2O_5$, $TaO_x$, $HfO_x$, $WO_x$, $TiO_x$, $ZrO_x$, etc. In some embodiments, the dielectric layer 206 may include one or more films. For example, the dielectric layer 206 may have a first film and a second film disposed on the first film. The second film may be different from the first film. In some embodiments, the first film includes a first metal oxide, and the second film includes a second metal oxide. For example, the first film may be $TaO_x$, while the second film may be $HfO_x$.

The top contact wire 208 and the bottom contact wire 210 may include conductive materials, such as metals. Example contact wires include Cu, Al, Au, Pt, W, etc.

The first insulating layer 216 may include SiON, SiN, $SiO_x$, CSiNH, CSiOH, or other insulting materials. The substrate 214 may include circuits for operating the memory device 200. The second insulating layer 218 may include $SiO_2$, $Si_3N_4$, TEOS, CSiNH, etc. The second insulating layer 218 extends to cover a top surface of the first insulating layer 216. The side surfaces 201-1 of the memory cells 201 may include side surfaces of the bottom electrode 202, the top electrode 204, and the dielectric layer 206. The side surfaces of the bottom electrode 202, the top electrode 204, and the dielectric layer 206 may be covered with an insulating layer, such as the second insulating layer 218. In some embodiments, the side surfaces of the bottom electrode 202, the top electrode 204, and the dielectric layer 206 may be covered by one or more oxides of the bottom electrode 202, the top electrode 204, or the dielectric layer 206. The third insulating layer 220 may include a low dielectric material, such as a Producer® Black Diamond®.

Figure 3A:
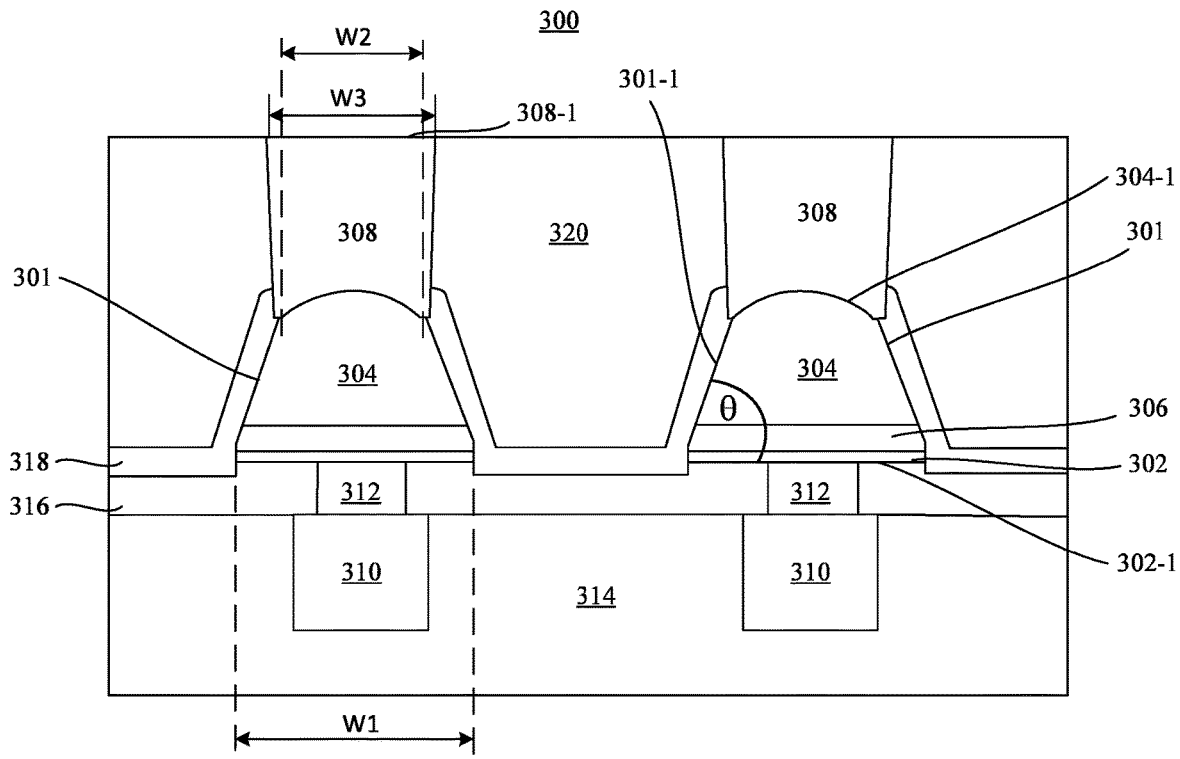
FIG. 3A is a schematic diagram illustrating a cross-section view of another memory device along the X direction, according to one example embodiment.

FIG. 3A is a schematic diagram illustrating a cross-section view of a memory device 300 along the X direction, according to one example embodiment. The memory device 300 includes a plurality of memory cells 301 (two are shown in FIG. 3A). Each of the memory cells 301 includes a bottom electrode 302, a top electrode 304, and a dielectric layer 306 interposed between the bottom electrode 302 and the top electrode 304. The bottom electrode 302 has a first width W1. A top surface 304-1 of the top electrode 304 is convex. The top surface 304-1 has a second width W2 between two edges of the top surface 304-1 despite the top surface 304-1 of the top electrode 304 not flat or planar. The top electrode 304 is coupled to a top contact wire 308. The top contact wire 308 has a top surface 308-1 that has a third width W3. The first width W1, the second width W2, and the third width W3 satisfy the following condition: W1>W3>W2. The bottom electrode 302 is coupled to a bottom contact wire 310 through a via 312. The bottom contact wire 310 is disposed on a substrate 314. The via 312 is disposed in a first insulating layer 316 that separates the bottom electrode 302 and the bottom contact wire 310. A second insulating layer 318 is disposed on the memory cells 301, covering side surfaces 301-1 and top surfaces of the memory cells 301. A third insulating layer 320 is formed on the second insulating layer 318. A cross-section view of the memory device 300 along the Y direction is similar to those shown in FIG. 2B such that a description of the memory cell structures for the memory cell 300 in the Y direction will be omitted. It should be noted that the corresponding heights H1, H2, H3 for memory device 300 also satisfy the following condition: H2>H1>H3 as shown in FIG. 2B. The structures in FIG. 3A include a taper angle θ of less than 82 degrees between a lower surface 302-1 of the bottom electrode 302 and the side surface 301-1 of the memory cells 301.

Figure 3B:
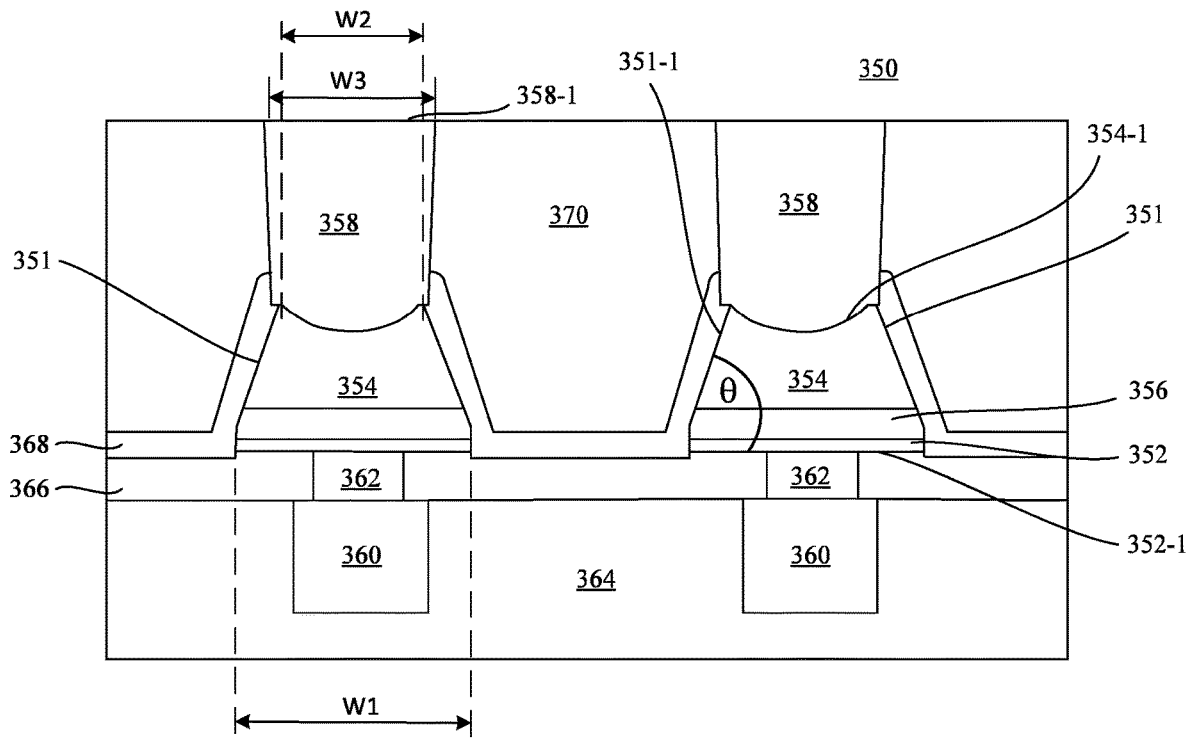
FIG. 3B is a schematic diagram illustrating a cross-section view of another memory device along the X direction, according to one example embodiment.

FIG. 3B is a schematic diagram illustrating a cross-section view of another memory device 350 along the X direction, according to one example embodiment. The memory device 350 includes a plurality of memory cells 351 (two are shown in FIG. 3B). Each of the memory cells 351 includes a bottom electrode 352, a top electrode 354, and a dielectric layer 356 interposed between the bottom electrode 352 and the top electrode 354. The bottom electrode 352 has a first width W1. A top surface 354-1 of the top electrode 354 is concave. The top surface 354-1 that has a second width W2 between two edges of the top surface 354-1 despite the top surface 354-1 of the top electrode 354 not flat or planar. The top electrode 354 is coupled to a top contact wire 358. The top contact wire 358 has a top surface 358-1 that has a third width W3. The first width W1, the second width W2, and the third width W3 satisfy the following condition: W1>W3>W2. The bottom electrode 352 is coupled to a bottom contact wire 360 through a via 362. The bottom contact wire 360 is disposed on a substrate 364. The via 362 is disposed in a first insulating layer 366 that separates the bottom electrode 352 and the bottom contact wire 360. A second insulating layer 368 is disposed on the memory cells 351, covering side surfaces 351-1 and top surfaces of the memory cells 351. A third insulating layer 370 is formed on the second insulating layer 368. A cross-section view of the memory device 350 along the Y direction is similar to those shown in FIG. 2B such that a description of the memory cell structures for the memory cell 350 in the Y direction will be omitted. It should be noted that the corresponding heights H1, H2, H3 for memory device 350 also satisfy the following condition: H2>H1>H3 as shown in FIG. 2B. The structures in FIG. 3B include a taper angle θ of less than 82 degrees between a lower surface 352-1 of the bottom electrode 352 and the side surface 351-1 of the memory cells 351.

Figure 4A:
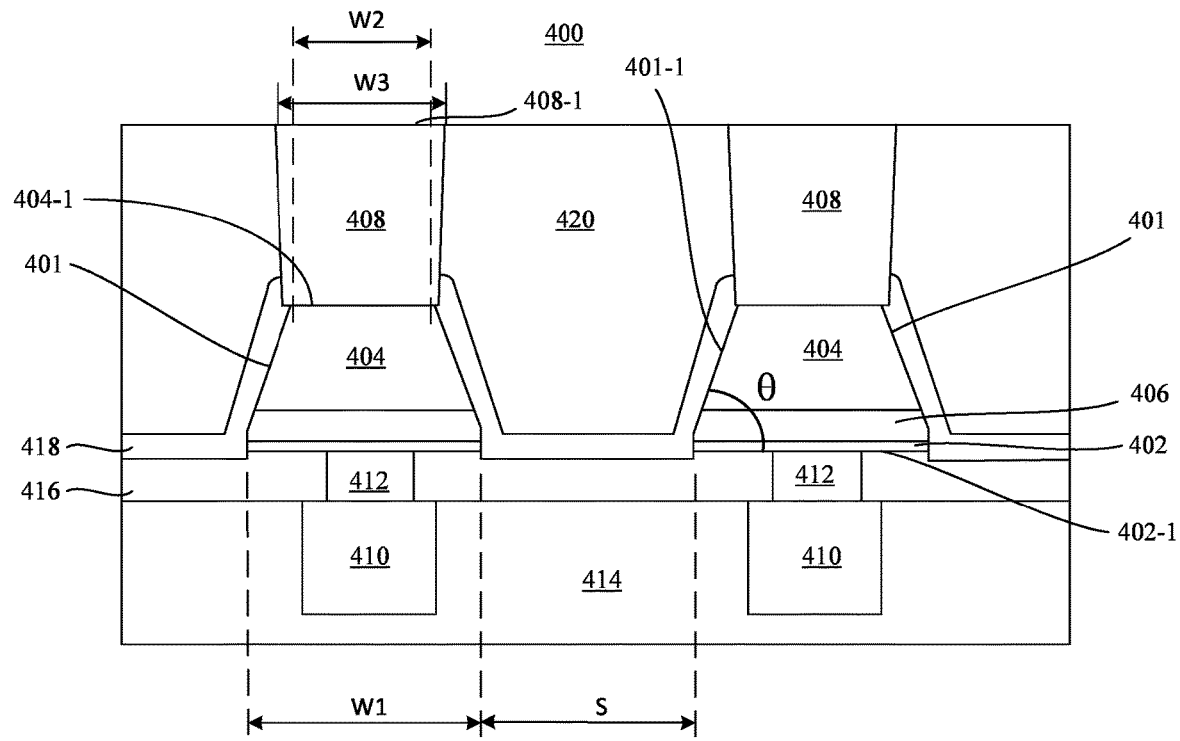
FIG. 4A is a schematic diagram illustrating a cross-section view of a memory device along the X direction, according to one example embodiment.
Figure 4B:
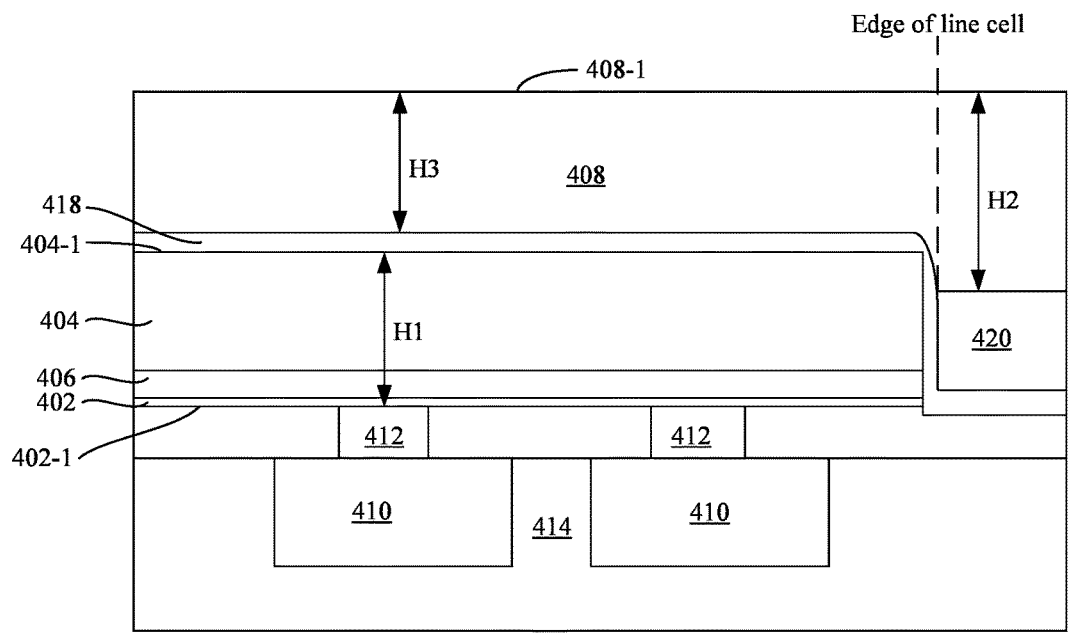
FIG. 4B is a schematic diagram illustrating a cross-section view of the memory device shown in FIG. 4A along the Y direction, according to one example embodiment.

Reference is now made to FIGS. 4A and 4B. FIG. 4A is a schematic diagram illustrating a cross-section view of a memory device 400 along the X direction, according to one example embodiment. FIG. 4B is a schematic diagram illustrating a cross-section view of the memory device 400 along the Y direction, according to one example embodiment.

Referring to FIGS. 4A and 4B, the memory device 400 includes a plurality of line memory cells 401 (two are shown in FIG. 4A). Each of the memory cells 401 includes a bottom electrode 402, a top electrode 404, and a dielectric layer 406 interposed between the bottom electrode 402 and the top electrode 404. The bottom electrode 402 has a first width W1. The top electrode 404 has a top surface 404-1 that has a second width W2 between two edges of the top surface 404-1. The top electrode 404 is coupled to a top contact wire 408. The top contact wire 408 has a top surface 408-1 that has a third width W3. The bottom electrode 402 is coupled to a bottom contact wire 410 through a via 412. The bottom contact wire 410 is disposed on a substrate 414. The via 412 is disposed in a first insulating layer 416 that separates the bottom electrode 402 and the bottom contact wire 410. A second insulating layer 418 is disposed on the memory cells 401, covering side surfaces 401-1 and top surfaces of the memory cells 401. A third insulating layer 420 is formed on the second insulating layer 418. The memory device 400 includes a distance S between bottom electrodes 402 of the two adjacent memory cells 401.

Referring to FIG. 4B, the memory cell 401 has a first height H1 extending from a lower surface 402-1 of the bottom electrode 402 to the top surface 404-1 of the top electrode 404. The top contact wire 408 has a second height H2 at a location outside of an edge of the line memory cells 401 and has a third height H3 extending between the top surface 408-1 of the top contact wire and the second insulating layer 418. The top contact wire 408 is coupled to the top electrode 404 via the opening in the second insulating layer 418 and the third insulating layer 420 (FIG. 4A).

In the improved memory cell structures shown in FIGS. 4A and 4B, the widths W1, W2, W3 and the heights H1, H2, H3 satisfy the following conditions: W1>W3>W2 and H2>H1>H3. Alternatively or additionally, the distance S between bottom electrodes 402, the width W3, and the heights H1, H2, H3 satisfy the following conditions: W3>S and H2>H1>H3. These conditions define an improved structure to prevent formation of voids in the third insulating layer 420. As shown in FIG. 4A, no void is formed in the third insulating layer 420 between two adjacent top contact wires 408. The structures result in the memory cells having a taper angle θ of less than 82 degrees between the lower surface 402-1 of the bottom electrode 402 and the side surface 401-1 of the memory cells 401. In some instances, the angle θ may be defined as between the side surface 401-1 of the memory cells 401 and a lower surface of the top electrode 404.

In some embodiments, in the improved memory cell structures in FIGS. 4A and 4B, the second height H2 is greater than the first height H1 by at least 10 nm. The first height H1 is greater than the third height H3 by at least 10 nm. In some embodiments, a thickness t1 of the top electrode 404 is more than two times a thickness t2 of the dielectric layer 406. For example, a first height H1, a second height H2, and a third height H3 for an example memory cell structure may be 110 nm, 135 nm, and 65-75 nm, respectively. In another example, the distance S between bottom electrodes 402 and the width W3 may be less than 120 nm and 150 nm, respectively.

Figure 5:
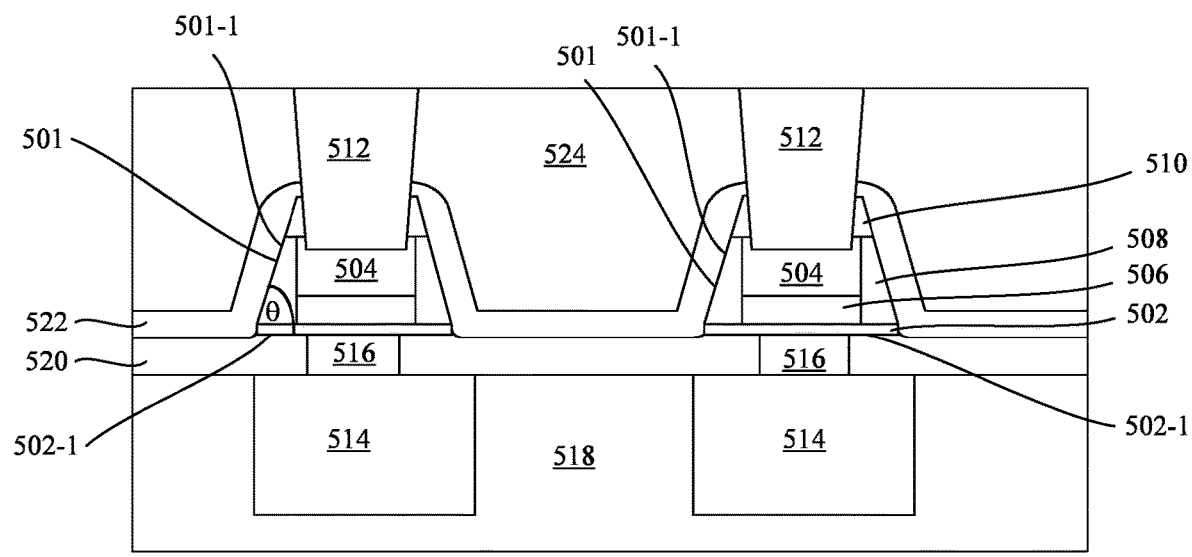
FIG. 5 is a schematic diagram illustrating a cross-section view of another memory device along the X direction, according to one example embodiment.

FIG. 5 is a schematic diagram illustrating a cross-section view of another memory device 500 along the X direction, according to one example embodiment. The memory device 500 includes a plurality of memory cells 501 (two are shown in FIG. 5). Each of the memory cells 501 includes a bottom electrode 502, a top electrode 504, a dielectric layer 506 interposed between the bottom electrode 502 and the top electrode 504, and insulating side walls 508. In some embodiments, the insulating side walls 508 includes one or more oxides of the bottom electrode 502, the top electrode 504, or the dielectric layer 506. A hard mask 510 is disposed on the memory cell 501. The top electrode 504 is coupled to a top contact wire 512. The bottom electrode 502 is coupled to a bottom contact wire 514 through a via 516. The bottom contact wire 514 is disposed on a substrate 518. The via 516 is disposed in a first insulating layer 520 that separates the bottom electrode 502 and the bottom contact wire 514. A second insulating layer 522 is disposed on the memory cells 501, covering side surfaces 501-1 of the memory cells 501 and top surfaces of the hard masks 510. The hard mask 510 may be an insulating layer interposed between the second insulating layer 522 and the top electrode 504. A third insulating layer 524 is formed on the second insulating layer 522. The width and height conditions similar to those described in connection with FIGS. 2A and 2B (or FIGS. 4A and 4B) may be applied to the memory device 500 to prevent formation of voids in the third insulating layer 524. The memory cell 501 has a taper angle θ of less than 82 degrees between a lower surface 502-1 of the bottom electrode 502 and the side surface 501-1 of the memory cells 501.

In one non-limited example, a dielectric layer, such as the dielectric layers 206 (FIGS. 2A, 2B), 306 (FIG. 3A), 356 (FIG. 3B), 406 (FIGS. 4A, 4B), and 506 (FIG. 5) may include $TaO_x$ and $HfO_2$ and have a thickness of 30 nm. A top electrode, such as the top electrodes 204 (FIGS. 2A, 2B), 304 (FIG. 3A), 354 (FIG. 3B), 404 (FIGS. 4A, 4B), and 504 (FIG. 5) may include TiN and have a thickness at least two times the thickness of the dielectric layer. In some embodiments, the top electrode may have a thickness at least three times the thickness of the dielectric layer to provide a better process margin for forming an opening in the insulting layers to connect the top electrodes to the top contact wires. In some embodiments, the thickness of the top electrode may be at least 60 nm or 90 nm.

For example, referring to FIG. 5, to provide openings to penetrate the third insulating layer 524 (Producer® Black Diamond®, 65 nm), the second insulating layer 522 (TEOS, 25 nm), and the hard mask 510 (silicon nitride, 10 nm) for the top contact wires 512 to reside therein, an etching process is conducted. Generally, after the third insulating layer 524 is formed on the second insulating layer 522, the surface of the third insulating layer 524 is rough and needs to be flattened. A chemical mechanical polishing (CMP) method is utilized to flatten the third insulating layer 524. A reactive ion etching (RIE) method is employed to remove a portion of the third insulating layer 524, the second insulating layer 522, and the hard mask 510 to form the opening. It is defined that, in a typical scenario, the CMP method removes a target thickness of the third insulating layer 524, and the RIE method removes a target amount of the insulating layers above the top electrode 504. In a worst scenario, the remaining thickness of the third insulating layer 524 after CMP is 120% of the target thickness, and the RIE method removes 95% of the target amount. In a best scenario, the remaining thickness of the third insulating layer 524 after CMP is 80% of the target thickness, and the RIE method removes 105% of the target amount. To ensure that the top contact wire 512 is connected to the top electrode 504, the RIE method is expected to remove a portion of the top electrode 504. This process is called over-etching. Table I below summarizes process margins in forming the opening for a memory cell structure having a top electrode, e.g., 504 (60 nm), twice as thick as a dielectric layer, e.g., 506 (30 nm). Table II below summarizes process margins in forming the opening for a memory cell structure having a top electrode, e.g., 504 (90 nm), three times as thick as a dielectric layer, e.g., 506 (30 nm). As evident in Tables I and II, when the top electrode is twice as thick as a dielectric layer, a reasonable process margin can be obtained; and when the top electrode is three times as thick as a dielectric layer, a good process margin can be obtained even in the worst process condition.

TABLE I

| Second insulating layer/third insulating layer RIE rate ratio | 0.4 | 0.45 | 0.5 | 0.55 | 0.65 |
|---|---|---|---|---|---|
| Worst process scenario | N | N | N | N | A |
| Typical process scenario | N | N | A | G | G |
| Best process scenario | A | G | G | G | G |

N: no process margin; A: acceptable process margin; G: good process margin.

TABLE II

| Second insulating layer/third insulating layer RIE rate ratio | 0.3 | 0.4 | 0.5 | 0.55 | 0.65 |
|---|---|---|---|---|---|
| Worst process scenario | N | A | G | G | G |
| Typical process scenario | N | A | G | G | G |
| Best process scenario | A | G | G | G | G |

N: no process margin; A: acceptable process margin; G: good process margin.

Figure 6:
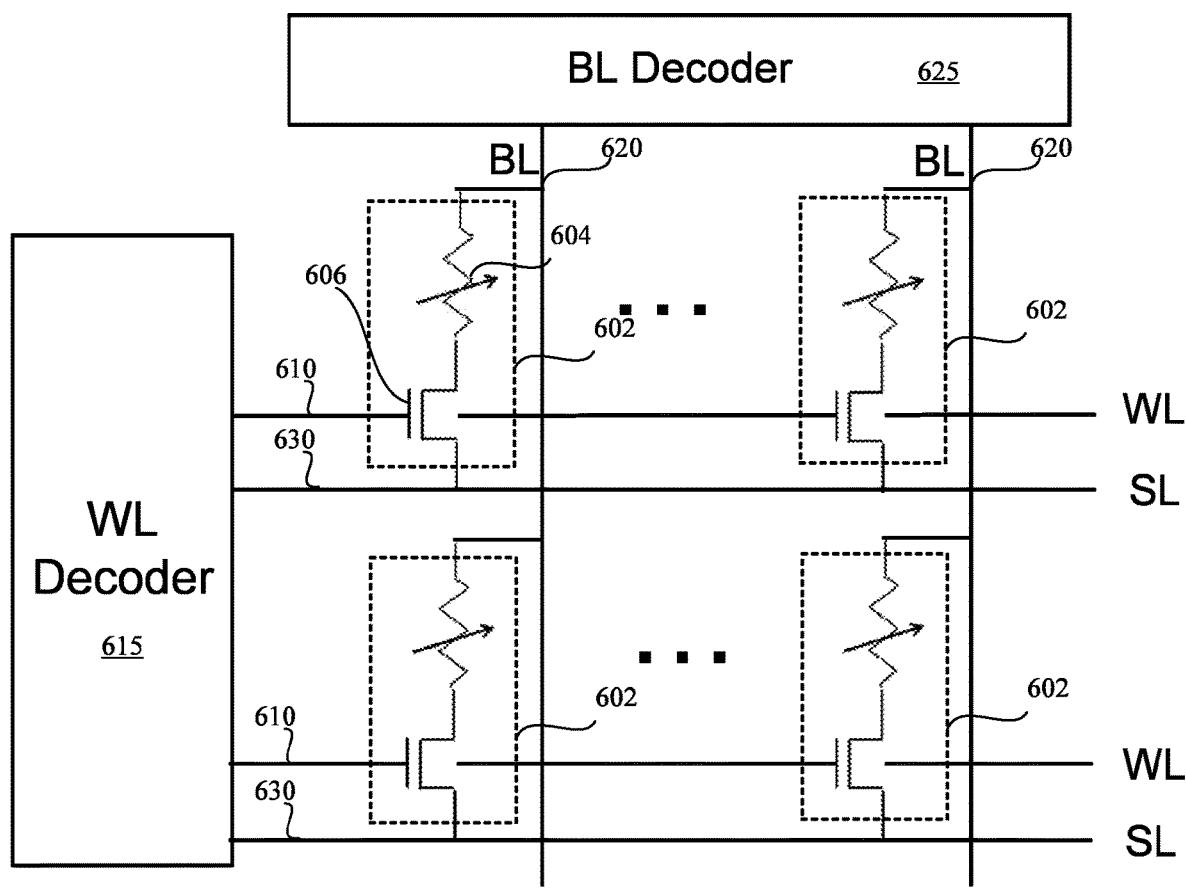
FIG. 6 shows a portion of a memory array that includes memory cells consistent with the present disclosure, according to one example embodiment.

The memory cell structures disclosed herein can be used to form a memory array for a memory device. FIG. 6 shows a portion of a memory device 600 that includes memory cell structures consistent with the present disclosure, according to one example embodiment. The memory device 600 includes a plurality of memory cells 602. Each of the memory cell may include a resistive element 604 and a transistor 606. The memory device 600 is arranged in a cross-point configuration having word lines 610 and bit lines 620. The word lines 610 and the bit lines 620 extend orthogonally to each other. A resistance memory cell 602 is located at each intersection of a word line 610 and a bit line 620. The word lines 610 are coupled to a word line decoder 615, which selects one of the word lines connected to a corresponding row of the resistance memory cells 602. The bit lines 620 are coupled to a bit line decoder 625, which selects one of the bit lines connected to a corresponding column of the resistance memory cells 602. The memory device 600 further includes a plurality of source lines 630 extending in parallel with the word lines 610. In some embodiments, the source lines 630 may instead extend in parallel with the bit lines 620.

A gate of the transistor 606 is connected to a word line 610. A source terminal of the transistor 606 is connected to a source line 630, and a drain terminal of the transistor 606 is connected to one terminal of a resistive element 604. Another terminal of the resistive element 604 is connected to a bit line 620. The resistance memory cell 602 at the intersection of the selected word line and the selected bit line is subject to a read, reset, or set operation, depending on the duration, magnitude and polarity of respective voltage pulses applied across the resistance memory cell 602 via the selected word line 610 and the selected bit line 620.

A memory device that includes the memory cells consistent with the above descriptions may be applied to various electric devices and systems. For example, the memory device may be part of a microcontroller unit, a radio-frequency identification system, etc.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

What is claimed is:

1. A memory device comprising:
   a memory cell comprising a bottom electrode, a top electrode, and a dielectric layer interposed between the bottom electrode and the top electrode, wherein:
      the bottom electrode has a first width W1;
      the top electrode has a top surface that has a second width W2 between two edges of the top surface; and
      the memory cell has a first height H1 extending from a lower surface of the bottom electrode to the top surface of the top electrode;
   an insulating layer covering side surfaces of the memory cell; and
   a top contact wire coupled to the top electrode via an opening in the insulating layer, wherein the top contact wire has a top surface that has a third width W3, a second height H2 at a location between two adjacent memory cells, and a third height H3 extending between the top surface of the top contact wire and the insulating layer,
   wherein the widths and the heights satisfy the following conditions: W1>W3>W2 and H2>H1>H3.

2. The memory device of claim 1, wherein an angle between the lower surface of the bottom electrode and one of the side surfaces of the memory cell is less than 82 degrees.

3. The memory device of claim 1, wherein the top surface of the top electrode is flat, convex, or concave.

4. The memory device of claim 1, wherein a distance between bottom electrodes of the two adjacent memory cells is smaller than the third width W3.

5. The memory device of claim 1, wherein the dielectric layer is a resistive layer that has resistance varying depending on a voltage between the top electrode and the bottom electrode.

6. The memory device of claim 5, wherein the resistive layer includes a first film and a second film disposed on the first film, the second film being different from the first film.

7. The memory device of claim 6, wherein:
the first film includes a first metal oxide; and
the second film includes a second metal oxide.

8. The memory device of claim 1, wherein the insulating layer is a first insulating layer and the memory device further comprises a second insulating layer disposed on the first insulating layer and between two adjacent top contact wires.

9. The memory device of claim 8, wherein the second insulating layer includes no voids between the two adjacent top contact wires.

10. The memory device of claim 8, wherein the first insulating layer includes silicon oxide.

11. The memory device of claim 10, wherein the second insulating layer includes a low dielectric material.

12. The memory device of claim 8, wherein the second insulating layer has a thickness greater than a thickness of the first insulating layer.

13. The memory device of claim 1, further comprising a bottom contact wire coupled to the bottom electrode.

14. The memory device of claim 1, wherein the bottom electrode includes at least one of TiN, TaN, or W.

15. The memory device of claim 1, wherein the top electrode includes at least one of TiN, TaN, or Ru.

16. The memory device of claim 1, wherein the second height H2 is greater than the first height H1 by at least 10 nm.

17. The memory device of claim 16, wherein the first height H1 is greater than the third height H3 by at least 10 nm.

18. The memory device of claim 8, further comprising a third insulating layer interposed between the first insulating layer and the top electrode.

19. The memory device of claim 1, wherein a thickness of the top electrode is at least two times a thickness of the dielectric layer.

20. A memory device comprising:
a plurality of memory cells, each of the memory cells comprising a bottom electrode, a top electrode, and a dielectric layer interposed between the bottom electrode and the top electrode, wherein each of the memory cells has a first height H1 extending from a lower surface of the bottom electrode to the top surface of the top electrode;
an insulating layer covering side surfaces of the memory cells; and
a top contact wire coupled to the top electrode via an opening in the insulating layer, wherein the top contact wire has a top surface that has a width, a second height H2 at a location between two adjacent memory cells, and a third height H3 extending between the top surface of the top contact wire and the insulating layer,
wherein a distance between bottom electrodes of the two adjacent memory cells is smaller than the width; and
wherein the heights satisfy the following condition: H2>H1>H3.

* * * * *